(12) United States Patent
Huang

(10) Patent No.: US 11,424,272 B2
(45) Date of Patent: Aug. 23, 2022

(54) DISPLAY PANEL WITH PIXEL STRUCTURE AND DISPLAY APPARATUS

(71) Applicant: HKC Corporation Limited, Shenzhen (CN)

(72) Inventor: Beizhou Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 742 days.

(21) Appl. No.: 16/334,155

(22) PCT Filed: Jun. 28, 2018

(86) PCT No.: PCT/CN2018/093369
§ 371 (c)(1),
(2) Date: Mar. 18, 2019

(87) PCT Pub. No.: WO2019/184112
PCT Pub. Date: Oct. 3, 2019

(65) Prior Publication Data
US 2021/0358955 A1      Nov. 18, 2021

(30) Foreign Application Priority Data
Mar. 28, 2018   (CN) .......................... 201810266833.0

(51) Int. Cl.
*H01L 27/14*   (2006.01)
*H01L 27/12*   (2006.01)
*G09G 3/36*    (2006.01)

(52) U.S. Cl.
CPC ........ *H01L 27/124* (2013.01); *H01L 27/1255* (2013.01); *G09G 3/3607* (2013.01);
(Continued)

(58) Field of Classification Search
CPC . G09G 3/3688; G02F 2201/40; H01L 27/124; H01L 27/1255
(Continued)

(56) References Cited

U.S. PATENT DOCUMENTS 9,070,716 B2 *  6/2015  Park ................... H01L 29/4908
2010/0220116 A1 * 9/2010  Liao ..................... G09G 3/3659
345/690

(Continued)

FOREIGN PATENT DOCUMENTS

CN       1573486 A    2/2005
CN     101667388 A    3/2010
(Continued)

OTHER PUBLICATIONS

International Search Report dated Feb. 22, 2019, in the corresponding PCT application PCT/CN2018 093369, 10 pages in Chinese.

*Primary Examiner* — Tan N Tran
(74) *Attorney, Agent, or Firm* — Juan Carlos A. Marquez; Marquez IP Law Office, PLLC

(57) ABSTRACT

A display panel includes a pixel structure, including a plurality of pixel groups, and the pixel group includes: a first switch, having a second end coupled to a first main pixel; a second switch, having a second end coupled to a first sub-pixel; a third switch, having a second end coupled to the first sub-pixel; a first capacitor, having one end coupled to a first end of the third switch and another end coupled to a common electrode; and a fourth switch, having a second end coupled to a second main pixel; a fifth switch, having a second end coupled to a second sub-pixel; a sixth switch, having a second end coupled to the second sub-pixel; a second capacitor, having one end coupled to a first end of the sixth switch and another end coupled to the common electrode.

18 Claims, 7 Drawing Sheets

(52) U.S. Cl.
CPC ... *G09G 3/3688* (2013.01); *G09G 2300/0465* (2013.01); *G09G 2300/0823* (2013.01); *G09G 2320/0242* (2013.01)

(58) Field of Classification Search
USPC .......................................... 257/72; 345/215
See application file for complete search history.

(56) References Cited

U.S. PATENT DOCUMENTS

| | | | |
|---|---|---|---|
| 2010/0259512 A1 | 10/2010 | Lin et al. | |
| 2011/0175884 A1* | 7/2011 | Ono | G09G 3/3648 345/211 |
| 2012/0062523 A1* | 3/2012 | Park | G02F 1/136213 345/204 |

FOREIGN PATENT DOCUMENTS

| | | |
|---|---|---|
| CN | 102636930 A | 8/2012 |
| CN | 104036750 A | 9/2014 |

* cited by examiner

DISPLAY PANEL WITH PIXEL STRUCTURE AND DISPLAY APPARATUS

BACKGROUND

Technical Field

This application relates to the display field, and in particular, to a display panel and a display apparatus.

Related Art

Liquid crystal display apparatuses have advantages of low costs, low power consumption and high performance and are widely applied to fields such as electronic products and digital products. Pixel units in a display apparatus need to be driven by driving corresponding scanning lines and data lines by a gate driver circuit and a source driver circuit. To further improve user experience and reduce costs, manufacturers develop many manufacturing technologies related to the display field, such as a half source driver (HSD) technology.

In the HSD technology, the number of data lines is halved, and the number of scanning lines is doubled, so that each data line is correspondingly connected to two columns of neighboring pixel units. By using this technology, a half of source driver chips may be saved. However, this technology also has a defect. Because a same data line is connected to two columns of pixel units and the doubled number of scanning lines enable a scanning time of pixel units to be shortened, problems such as inconsistent charging efficiency, unbalanced parasitic capacitance between pixel units and delay distortion in signal waveforms occur easily, and consequently phenomena such as large-viewing-angle color shift and vertical bright and dark lines occur in the display apparatus.

Therefore, related technicians in the industry are urgently required to research, develop and design an innovative pixel circuit and structure, so as to overcome the problem and the defect existing in the foregoing HSD technology.

SUMMARY

To resolve the foregoing technical problem, an objective of this application is to provide a display panel and a display apparatus.

The objective of this application is achieved and the technical problem of this application is resolved by using the following technical solutions. A display panel provided according to this application comprises a pixel structure, where the pixel structure comprises a plurality of pixel groups, and each of the pixel groups comprises: a first pixel unit, comprising: a first switch, having a control end coupled to an $n^{th}$ scanning line, a first end coupled to an $m^{th}$ data line, and a second end coupled to a first main pixel; a second switch, having a control end coupled to the $n^{th}$ scanning line, a first end coupled to the $m^{th}$ data line, and a second end coupled to a first subpixel; a third switch, having a control end coupled to an $(n+1)^{th}$ scanning line and a second end coupled to the first subpixel; and a first capacitor, having one end coupled to a first end of the third switch and another end coupled to a common electrode; and a second pixel unit, comprising: a fourth switch, having a control end coupled to the $(n+1)^{th}$ scanning line, a first end coupled to the $m^{th}$ data line, and a second end coupled to a second main pixel; a fifth switch, having a control end coupled to the $(n+1)^{th}$ scanning line, a first end coupled to the $m^{th}$ data line, and a second end coupled to a second subpixel; a sixth switch, having a control end coupled to the $n^{th}$ scanning line and a second end coupled to the second subpixel, where n and m are positive numbers; and a second capacitor, having one end coupled to a first end of the sixth switch and another end coupled to the common electrode. The first capacitor and the second capacitor comprise a first metal layer, a dielectric layer and a second metal layer, and the dielectric layer is one of a gate insulation layer, an insulation protection layer or a passivation layer.

In an embodiment of this application, in a first period of time, the $n^{th}$ scanning line is conducted, and the first switch, the second switch and the sixth switch are switched on.

In an embodiment of this application, the first switch and the second switch respectively charge the first main pixel and the first subpixel.

In an embodiment of this application, the sixth switch discharges to the second subpixel by using the second capacitor.

In an embodiment of this application, in a second period of time, the $(n+1)^{th}$ scanning line is conducted, and the third switch, the fourth switch and the fifth switch are switched on.

In an embodiment of this application, the fourth switch and the fifth switch respectively charge the second main pixel and the second subpixel.

In an embodiment of this application, the third switch discharges to the first subpixel by using the first capacitor.

In an embodiment of this application, a data scanning manner of the display panel comprises dot inversion, column inversion, row inversion or frame inversion.

The objective and the technical problem of this application may be further resolved by taking the following technical measures.

Another objective of this application is to provide a display panel, comprising a pixel structure, where the pixel structure comprises a plurality of pixel groups, and each of the pixel groups comprises: a first pixel unit, comprising: a first switch, having a control end coupled to an $n^{th}$ scanning line, a first end coupled to an $m^{th}$ data line, and a second end coupled to a first main pixel; a second switch, having a control end coupled to the $n^{th}$ scanning line, a first end coupled to the $m^{th}$ data line, and a second end coupled to a first subpixel; a third switch, having a control end coupled to an $(n+1)^{th}$ scanning line and a second end coupled to the first subpixel; and a first capacitor, having one end coupled to a first end of the third switch and another end coupled to a common electrode; and a second pixel unit, comprising: a fourth switch, having a control end coupled to the $(n+1)^{th}$ scanning line, a first end coupled to the $m^{th}$ data line, and a second end coupled to a second main pixel; a fifth switch, having a control end coupled to the $(n+1)^{th}$ scanning line, a first end coupled to the $m^{th}$ data line, and a second end coupled to a second subpixel; a sixth switch, having a control end coupled to the $n^{th}$ scanning line and a second end coupled to the second subpixel, where n and m are positive numbers; and a second capacitor, having one end coupled to a first end of the sixth switch and another end coupled to the common electrode. The first capacitor and the second capacitor comprise a first metal layer, a dielectric layer and a second metal layer, and the dielectric layer is one of a gate insulation layer, an insulation protection layer or a passivation layer. In a first period of time, the $n^{th}$ scanning line is conducted, and the first switch, the second switch and the sixth switch are switched on, the first switch and the second switch respectively charge the first main pixel and the first subpixel, and the sixth switch discharges to the second subpixel by using the second capacitor; and in a second period of time, the (n+1)$^{th}$ scanning line is conducted, and the third switch, the fourth switch and the fifth switch are switched on, the fourth switch and the fifth switch respectively charge the second main pixel and the second subpixel, and the third switch discharges to the first subpixel by using the first capacitor.

Still another objective of this application is to provide a display apparatus, comprising a display panel, where the display panel comprises a pixel structure, the pixel structure comprises a plurality of pixel groups, and each of the pixel groups comprises: a first pixel unit, comprising: a first switch, having a control end coupled to an n$^{th}$ scanning line, a first end coupled to an m$^{th}$ data line, and a second end coupled to a first main pixel; a second switch, having a control end coupled to the n$^{th}$ scanning line, a first end coupled to the m$^{th}$ data line, and a second end coupled to a first subpixel; a third switch, having a control end coupled to an (n+1)$^{th}$ scanning line and a second end coupled to the first subpixel; and a first capacitor, having one end coupled to a first end of the third switch and another end coupled to a common electrode; and a second pixel unit, comprising: a fourth switch, having a control end coupled to the (n+1)$^{th}$ scanning line, a first end coupled to the m$^{th}$ data line, and a second end coupled to a second main pixel; a fifth switch, having a control end coupled to the (n+1)$^{th}$ scanning line, a first end coupled to the m$^{th}$ data line, and a second end coupled to a second subpixel; a sixth switch, having a control end coupled to the n$^{th}$ scanning line and a second end coupled to the second subpixel, where n and m are positive numbers; and a second capacitor, having one end coupled to a first end of the sixth switch and another end coupled to the common electrode. The first capacitor and the second capacitor comprise a first metal layer, a dielectric layer and a second metal layer, and the dielectric layer is one of a gate insulation layer, an insulation protection layer or a passivation layer.

In an embodiment of this application, in a first period of time, the n$^{th}$ scanning line is conducted, and the first switch, the second switch and the sixth switch are switched on.

In an embodiment of this application, the first switch and the second switch respectively charge the first main pixel and the first subpixel.

In an embodiment of this application, the sixth switch discharges to the second subpixel by using the second capacitor.

In an embodiment of this application, in a second period of time, the (n+1)$^{th}$ scanning line is conducted, and the third switch, the fourth switch and the fifth switch are switched on.

In an embodiment of this application, the fourth switch and the fifth switch respectively charge the second main pixel and the second subpixel.

In an embodiment of this application, the third switch discharges to the first subpixel by using the first capacitor.

In an embodiment of this application, a data scanning manner of the display panel comprises dot inversion, column inversion, row inversion or frame inversion.

In this application, by designing a pixel circuit and structure, a large-viewing-angle color shift problem of an HSD display panel may be resolved, and there is no limitation in a scanning direction of the display panel.

DETAILED DESCRIPTION

The following embodiments are described with reference to the accompanying drawings, used to exemplify specific embodiments for implementation of this application. Terms about directions mentioned in this application, such as "on", "below", "front", "back", "left", "right", "in", "out", and "side surface" merely refer to directions in the accompanying drawings. Therefore, the used terms about directions are used to describe and understand this application, and are not intended to limit this application.

The accompanying drawings and the description are considered to be essentially exemplary, rather than limitative. In the figures, modules with similar structures are represented by using the same reference number. In addition, for understanding and ease of description, the size and the thickness of each component shown in the accompanying drawings are arbitrarily shown, but this application is not limited thereto.

In the accompanying drawings, for clarity, thicknesses of a layer, a film, a panel, an area, and the like are enlarged. In the accompanying drawings, for understanding and ease of description, thicknesses of some layers and areas are enlarged. It should be understood that when a component such as a layer, a film, an area, or a base is described to be "on" "another component", the component may be directly on the another component, or there may be an intermediate component.

In addition, throughout this specification, unless otherwise explicitly described to have an opposite meaning, the word "include" is understood as including the component, but not excluding any other component. In addition, throughout this specification, "on" means that one is located above or below a target component and does not necessarily mean that one is located on the top based on a gravity direction.

To further describe technical measures taken in this application to achieve the intended objectives and effects thereof, specific implementations, structures, features, and effects of a display panel and a display apparatus provided according to this application are described below in detail with reference to the accompanying drawings and specific embodiments.

Figure 1:
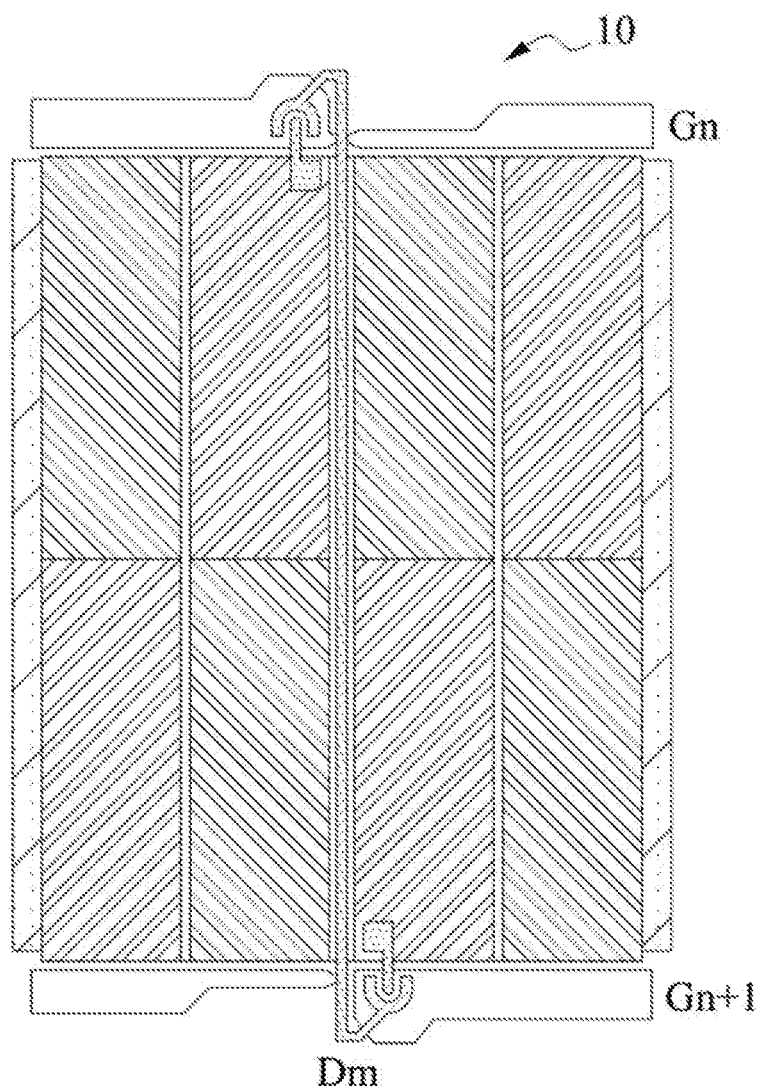
FIG. 1 is a schematic diagram of an exemplary pixel structure.
Figure 2:
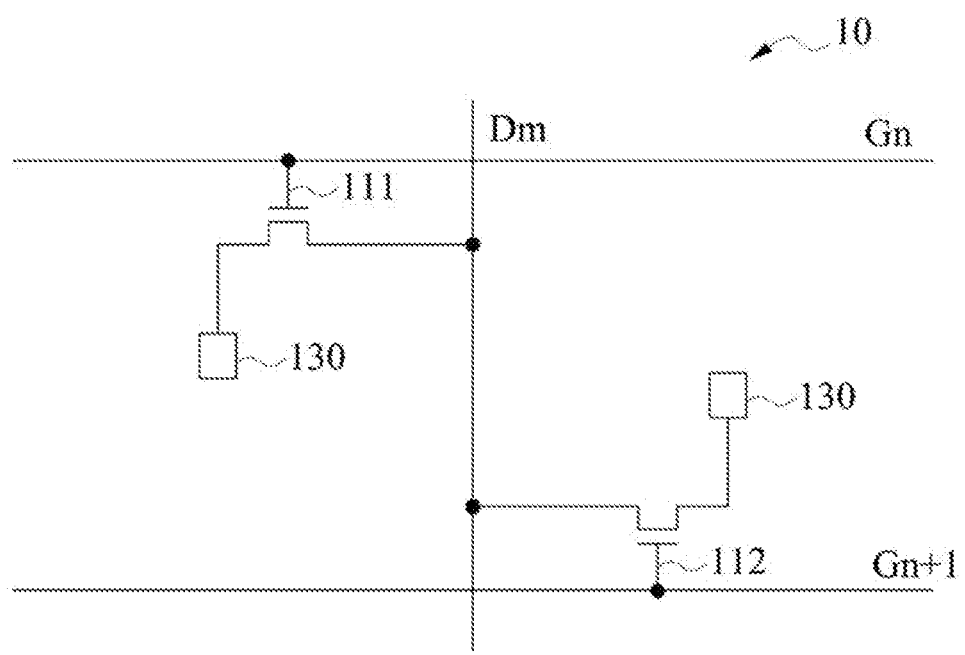
FIG. 2 is a schematic diagram of an equivalent circuit of an exemplary pixel structure.

FIG. 1 is a schematic diagram of an exemplary pixel structure, and FIG. 2 is a schematic diagram of an equivalent circuit of an exemplary pixel structure. Referring to FIG. 1 and FIG. 2, an exemplary pixel structure 10 includes: a plurality of scanning lines (Gn, Gn+1), and a plurality of data lines Dm intersecting the scanning lines, to define a plurality of pixel regions. A plurality of active switches (being, for example, an active switch 111 and an active switch 112 in the figures) is correspondingly disposed in the pixel regions, and is coupled to pixels 130 in the corresponding pixel regions. The active switch 111 and the active switch 112 adjacent to each other are coupled to different scanning lines, and are coupled to a same data line. By designing this pixel structure, the number of data lines may be halved, thereby reducing the number of data driver chips (Source Driver) and also driving the entire pixel structure. However, because a same data line is connected to two neighboring columns of pixel units and the doubled number of scanning lines enable a scanning time of pixel units to be shortened, problems such as inconsistent charging efficiency, unbalanced parasitic capacitance between pixel units and delay distortion in signal waveforms occur easily, and consequently phenomena such as large-viewing-angle color shift, vertical bright and dark lines and even Gamma inversion occur in a formed display panel or display apparatus.

Figure 3:
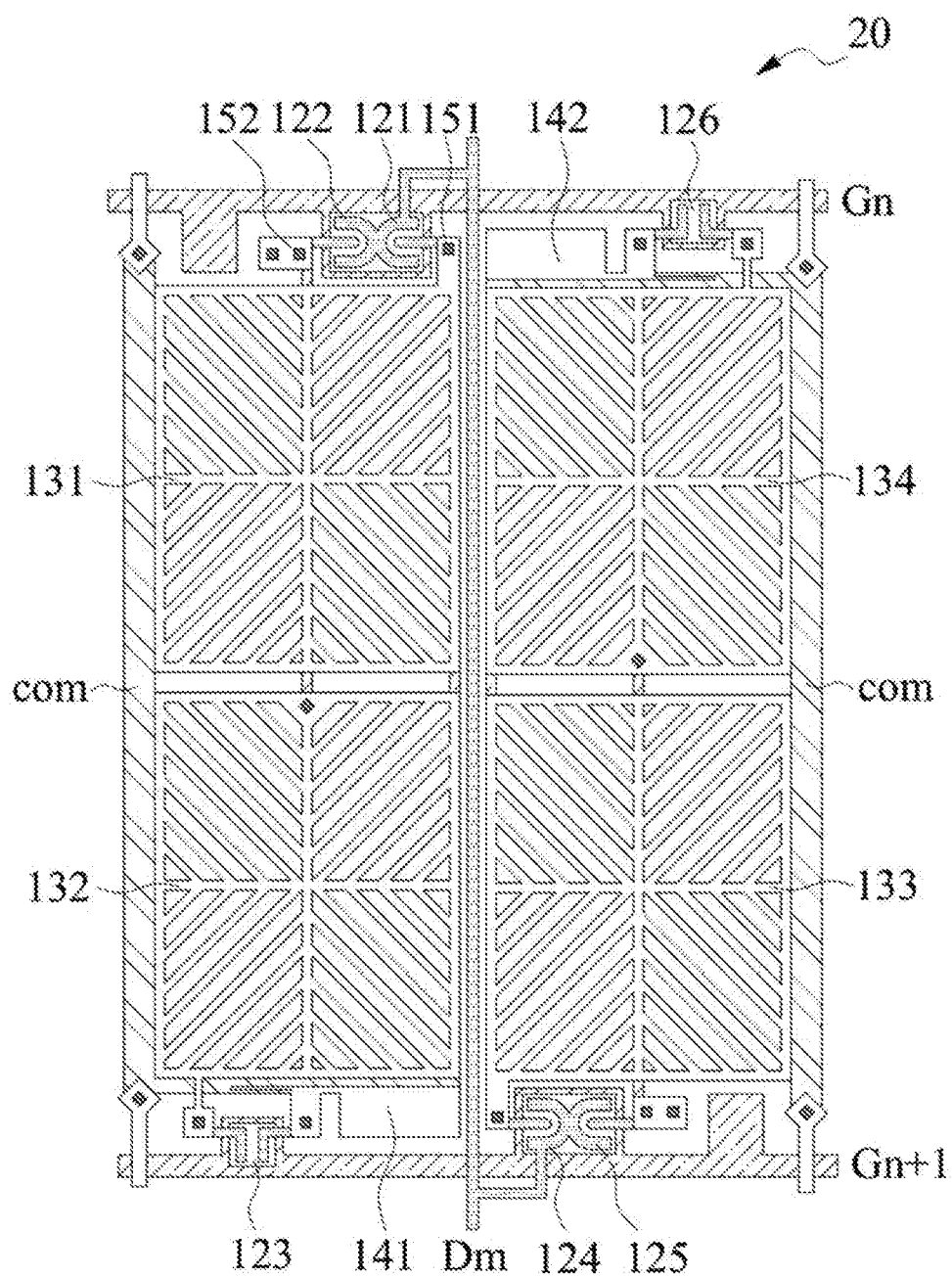
FIG. 3 is a schematic diagram of a pixel structure according to an embodiment of this application.
Figure 4:
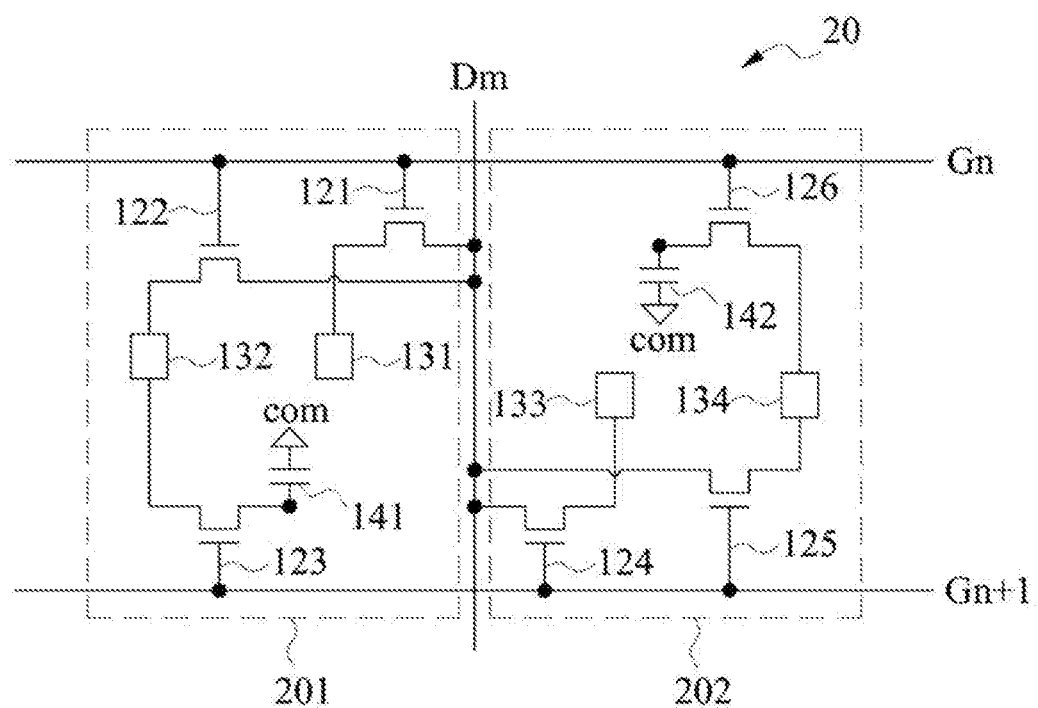
FIG. 4 is a schematic diagram of an equivalent circuit of a pixel structure according to an embodiment of this application.

FIG. 3 is a schematic diagram of a pixel structure according to an embodiment of this application, and FIG. 4 is a schematic diagram of an equivalent circuit of a pixel structure according to an embodiment of this application. Referring to FIG. 3 and FIG. 4, in an embodiment of this application, a display panel includes a pixel structure 20, where the pixel structure includes a plurality of pixel groups, and each of the pixel groups includes: a first pixel unit 201, including: a first switch 121, having a control end coupled to an $n^{th}$ scanning line, a first end coupled to an $m^{th}$ data line, and a second end coupled to a first main pixel 131; a second switch 122, having a control end coupled to the $n^{th}$ scanning line, a first end coupled to the $m^{th}$ data line, and a second end coupled to a first subpixel 132; a third switch 123, having a control end coupled to an $(n+1)^{th}$ scanning line and a second end coupled to the first subpixel 132; and a first capacitor 141, having one end coupled to a first end of the third switch and another end coupled to a common electrode com; and a second pixel unit 202, including: a fourth switch 124, having a control end coupled to the $(n+1)^{th}$ scanning line, a first end coupled to the $m^{th}$ data line, and a second end coupled to a second main pixel 133; a fifth switch 125, having a control end coupled to the $(n+1)^{th}$ scanning line, a first end coupled to the $m^{th}$ data line, and a second end coupled to a second subpixel 134; a sixth switch 126, having a control end coupled to the $n^{th}$ scanning line and a second end coupled to the second subpixel 134, where n and m are positive numbers; and a second capacitor 142, having one end coupled to a first end of the sixth switch and another end coupled to the common electrode com.

In some embodiments, in a first period of time, the $n^{th}$ scanning line Gn is conducted, and the first switch 121, the second switch 122 and the sixth switch 126 are switched on.

In some embodiments, by using a data line Dm, the first switch 121 and the second switch 122 respectively charge the first main pixel 131 and the first subpixel 132.

In some embodiments, the sixth switch 126 discharges to the second subpixel 134 of the second pixel unit 202 by using the second capacitor 142. Charges of the second subpixel 134 are conducted to the common electrode com by using the second capacitor 142.

In some embodiments, in a second period of time, the $(n+1)^{th}$ scanning line Gn+1 is conducted, and the third switch 123, the fourth switch 124 and the fifth switch 125 are switched on.

In some embodiments, the fourth switch 124 and the fifth switch 125 respectively charge the second main pixel 133 and the second subpixel 134.

In some embodiments, the third switch 123 discharges to the first subpixel 132 by using the first capacitor 141. Charges of the first subpixel 132 are conducted to the common electrode com by using the first capacitor 141.

Figure 5:
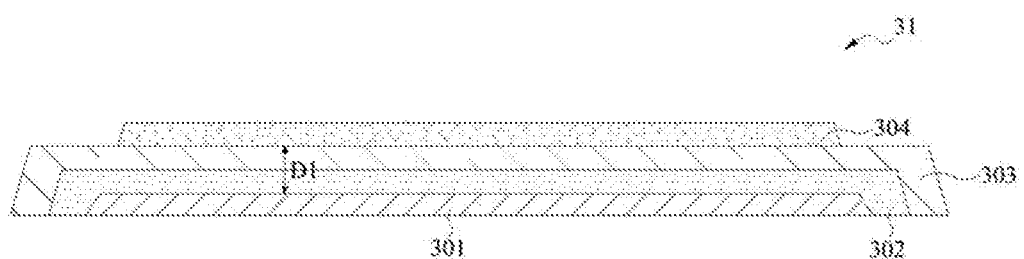
FIG. 5 is a schematic cross-sectional diagram of a capacitor according to an embodiment of this application.

FIG. 5 is a schematic cross-sectional diagram of a capacitor according to an embodiment of this application. Referring to FIG. 3 to FIG. 5, in an embodiment of this application, a capacitor 31 includes a first metal layer 301, a gate insulation layer 302, a protection layer 303 and a second metal layer 304. In manufacturing, the first metal layer 301 may be formed together with the scanning line by using a same masking process, and the second metal layer may be, for example, an indium tin oxide ITO. The capacitor 31 may be the first capacitor 141 and the second capacitor 142.

Figure 6:
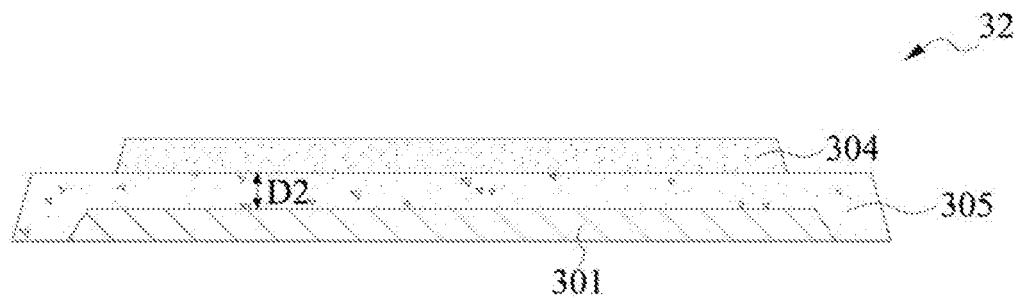
FIG. 6 is a schematic cross-sectional diagram of a capacitor according to another embodiment of this application.

FIG. 6 is a schematic cross-sectional diagram of a capacitor according to another embodiment of this application. Referring to FIG. 3 to FIG. 6 together, in an embodiment of this application, a display panel includes a pixel structure 20, where the pixel structure includes a plurality of pixel groups, and each of the pixel groups includes: a first pixel unit 201, including: a first switch 121, having a control end coupled to an $n^{th}$ scanning line, a first end coupled to an $m^{th}$ data line, and a second end coupled to a first main pixel 131; a second switch 122, having a control end coupled to the $n^{th}$ scanning line, a first end coupled to the $m^{th}$ data line, and a second end coupled to a first subpixel 132; a third switch 123, having a control end coupled to an $(n+1)^{th}$ scanning line and a second end coupled to the first subpixel 132; and a first capacitor 141, having one end coupled to a first end of the third switch and another end coupled to a common electrode com; and a second pixel unit 202, including: a fourth switch 124, having a control end coupled to the $(n+1)^{th}$ scanning line, a first end coupled to the $m^{th}$ data line, and a second end coupled to a second main pixel 133; a fifth switch 125, having a control end coupled to the $(n+1)^{th}$ scanning line, a first end coupled to the $m^{th}$ data line, and a second end coupled to a second subpixel 134; a sixth switch 126, having a control end coupled to the $n^{th}$ scanning line and a second end coupled to the second subpixel 134, where n and m are positive numbers; and a second capacitor 142, having one end coupled to a first end of the sixth switch and another end coupled to the common electrode com. The first capacitor 141 and the second capacitor 142 may be a capacitor 32, including a first metal layer 301, a dielectric layer 305 and a second metal layer 304.

In an embodiment of this application, the dielectric layer 305 may be, for example, one of a gate insulation layer, an insulation protection layer or a passivation layer, and a material of the dielectric layer 305 may be, for example, a silicon nitride, a silicon oxide, or an aluminum silicon oxide. The first metal layer may be, for example, formed in a same manufacturing process by using a same material as that of the scanning line. The second metal layer may be, for example, formed in a same manufacturing process by using a same material as that of the data line.

Then referring to FIG. 5 and FIG. 6, as shown in FIG. 5, a distance between the first metal layer 301 and the second metal layer 304 is a thickness D1 of the gate insulation layer 302 and the protection layer 303. As shown in FIG. 6, a distance between the first metal layer 301 and the second metal layer 304 is a thickness D2 of the dielectric layer 305. In a same manufacturing device, the thickness D2 may be made less than the thickness D1. Moreover, because only one dielectric layer exists between the metal layers (301, 304), and a value of capacitance is in a direct proportion to an overlapping area between the two metal layers and in an inverse proportion to the distance between the two metal layers, compared with the capacitor 31 in FIG. 5, the capacitor 32 in FIG. 6 may achieve same capacitance with a smaller area. Based on decrease in area, the aperture ratio and the transmission rate of the pixel unit may be improved.

In some embodiments, a data scanning manner of the display panel includes dot inversion, column inversion, row inversion or frame inversion. When a scanning direction is from G1 to Gn (in this embodiment, that is, from the first period of time to the second period of time), pixels at odd-numbered columns play a role of low color shift. When a scanning direction is from Gn to G1 (in this embodiment, that is, from the second period of time to the first period of time), pixels at even-numbered columns play a role of low color shift. Therefore, according to a scanning manner and a change in a scanning direction corresponding to the scanning manner, a half of pixels of the pixel structure 20 (including a main pixel and a subpixel) play a role of low color shift.

In some embodiments, the first switch 121 and the fourth switch 124 are respectively connected to the first main pixel 131 and the second main pixel 133 by using a first protection layer 151. The second switch 122 and the third switch 123 are connected to the first subpixel 132 by using a second protection layer 152. The fifth switch 125 and the sixth switch 126 are connected to the second subpixel 134 by using the second protection layer 152.

In some embodiments, the display panel of this application may be, for example, a liquid crystal display panel, but is not limited thereto, or may be an organic light-emitting diode (OLED) display panel, a white OLED (W-OLED) display panel, a quantum-dot light-emitting diode (QLED) display panel, a plasma display panel, a curved display panel or another type of display panel.

Figure 7:
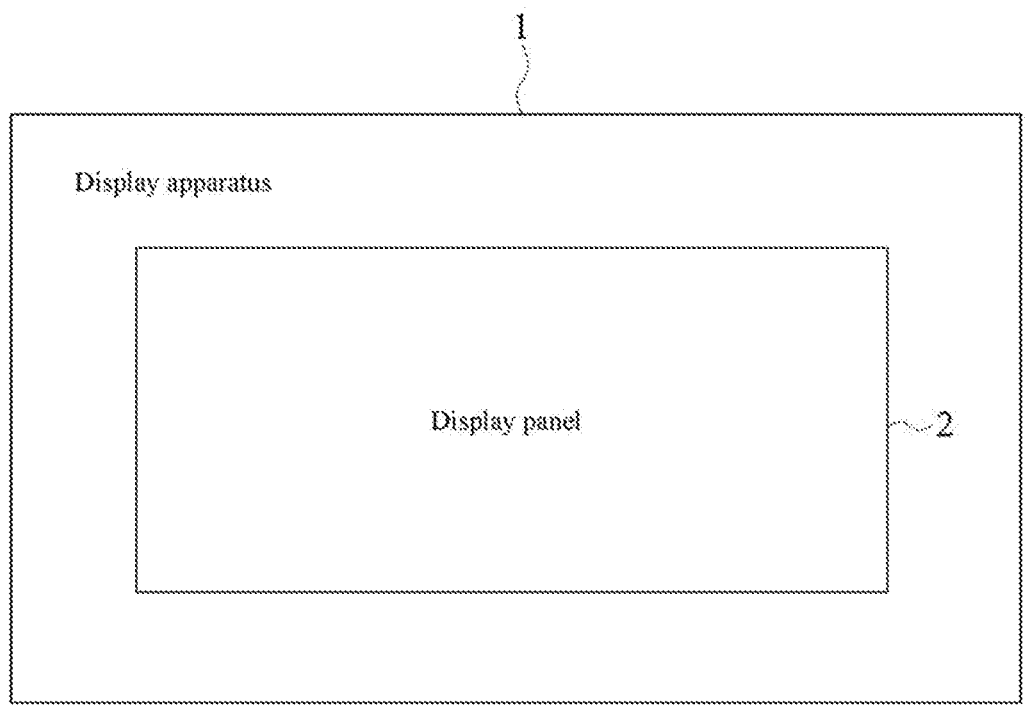
FIG. 7 is a module diagram of a display apparatus according to an embodiment of this application.

FIG. 7 is a module diagram of a display apparatus according to an embodiment of this application. Referring to FIG. 3 to FIG. 5 together, a display apparatus 1 includes a display panel 2 described in the foregoing embodiments, and a pixel structure 20 of the display panel 2.

In this application, by designing a pixel circuit and structure, a large-viewing-angle color shift problem of an HSD display panel may be resolved, the aperture ratio of the display panel is improved, and there is no limitation in a scanning direction of the display panel.

The wordings such as "in some embodiments" and "in various embodiments" are repeatedly used. The wordings usually refer to different embodiments, but they may also refer to a same embodiment. The words, such as "comprise", "have", and "include", are synonyms, unless other meanings are indicated in the context thereof.

Descriptions above are merely embodiments of this application, and are not intended to limit this application. Although this application has been disclosed above in forms of specific embodiments, the embodiments are not intended to limit this application. A person skilled in the art can make some equivalent variations, alterations or modifications to the above disclosed technical content without departing from the scope of the technical solutions of this application to obtain equivalent embodiments. Any simple alteration, equivalent change or modification made to the foregoing embodiments according to the technical essence of this application without departing from the content of the technical solutions of this application shall fall within the scope of the technical solutions of this application.

What is claimed is:

1. A display panel, comprising a pixel structure, wherein the pixel structure comprises a plurality of pixel groups, and each of the pixel groups comprises:
    a first pixel unit, comprising:
        a first switch, having a control end coupled to an $n^{th}$ scanning line, a first end coupled to an $m^{th}$ data line, and a second end coupled to a first main pixel;
        a second switch, having a control end coupled to the $n^{th}$ scanning line, a first end coupled to the $m^{th}$ data line, and a second end coupled to a first subpixel;
        a third switch, having a control end coupled to an $(n+1)^{th}$ scanning line and a second end coupled to the first subpixel; and
        a first capacitor, having one end coupled to a first end of the third switch and another end coupled to a common electrode; and
    a second pixel unit, comprising:
        a fourth switch, having a control end coupled to the $(n+1)^{th}$ scanning line, a first end coupled to the $m^{th}$ data line, and a second end coupled to a second main pixel;
        a fifth switch, having a control end coupled to the $(n+1)^{th}$ scanning line, a first end coupled to the $m^{th}$ data line, and a second end coupled to a second subpixel;
        a sixth switch, having a control end coupled to the $n^{th}$ scanning line and a second end coupled to the second subpixel, wherein n and m are positive numbers; and
        a second capacitor, having one end coupled to a first end of the sixth switch and another end coupled to the common electrode,
    wherein the first capacitor and the second capacitor comprise a first metal layer, a dielectric layer and a second metal layer, and the dielectric layer is one of a gate insulation layer, an insulation protection layer or a passivation layer;
    wherein a data scanning manner of the display panel comprises column inversion, row inversion or frame inversion.

2. The display panel according to claim 1, wherein in a first period of time, the $n^{th}$ scanning line is conducted, and the first switch, the second switch and the sixth switch are switched on.

3. The display panel according to claim 2, wherein the first switch charges the first main pixel.

4. The display panel according to claim 3, wherein the second switch charges the first subpixel.

5. The display panel according to claim 4, wherein the sixth switch discharges to the second subpixel by using the second capacitor.

6. The display panel according to claim 1, wherein in a second period of time, the $(n+1)^{th}$ scanning line is conducted, and the third switch, the fourth switch and the fifth switch are switched on.

7. The display panel according to claim 6, wherein the fourth switch charges the second main pixel, and the fifth switch charges the second subpixel.

8. The display panel according to claim 7, wherein the third switch discharges to the first subpixel by using the first capacitor.

9. A display panel, comprising a pixel structure, wherein the pixel structure comprises a plurality of pixel groups, and each of the pixel groups comprises:
    a first pixel unit, comprising:
        a first switch, having a control end coupled to an $n^{th}$ scanning line, a first end coupled to an $m^{th}$ data line, and a second end coupled to a first main pixel;
        a second switch, having a control end coupled to the $n^{th}$ scanning line, a first end coupled to the $m^{th}$ data line, and a second end coupled to a first subpixel;
        a third switch, having a control end coupled to an $(n+1)^{th}$ scanning line and a second end coupled to the first subpixel; and a first capacitor, having one end coupled to a first end of the third switch and another end coupled to a common electrode; and a second pixel unit, comprising:
- a fourth switch, having a control end coupled to the $(n+1)^{th}$ scanning line, a first end coupled to the $m^{th}$ data line, and a second end coupled to a second main pixel;
- a fifth switch, having a control end coupled to the $(n+1)^{th}$ scanning line, a first end coupled to the $m^{th}$ data line, and a second end coupled to a second subpixel;
- a sixth switch, having a control end coupled to the $n^{th}$ scanning line and a second end coupled to the second subpixel, wherein n and m are positive numbers; and
- a second capacitor, having one end coupled to a first end of the sixth switch and another end coupled to the common electrode, wherein the first capacitor and the second capacitor comprise a first metal layer, a dielectric layer and a second metal layer, and the dielectric layer is a combination of at least one of a gate insulation layer, an insulation protection layer or a passivation layer;

in a first period of time, the $n^{th}$ scanning line is conducted, and the first switch, the second switch and the sixth switch are switched on, the first switch and the second switch respectively charge the first main pixel and the first subpixel, and the sixth switch discharges to the second subpixel by using the second capacitor; and in a second period of time, the $(n+1)^{th}$ scanning line is conducted, and the third switch, the fourth switch and the fifth switch are switched on, the fourth switch and the fifth switch respectively charge the second main pixel and the second subpixel, and the third switch discharges to the first subpixel by using the first capacitor;

wherein a data scanning manner of the display panel comprises column inversion, row inversion or frame inversion.

10. A display apparatus, comprising a display panel, wherein the display panel comprises a pixel structure, the pixel structure comprises a plurality of pixel groups, and each of the pixel groups comprises:

a first pixel unit, comprising:
- a first switch, having a control end coupled to an $n^{th}$ scanning line, a first end coupled to an $m^{th}$ data line, and a second end coupled to a first main pixel;
- a second switch, having a control end coupled to the $n^{th}$ scanning line, a first end coupled to the $m^{th}$ data line, and a second end coupled to a first subpixel;
- a third switch, having a control end coupled to an $(n+1)^{th}$ scanning line and a second end coupled to the first subpixel; and
- a first capacitor, having one end coupled to a first end of the third switch and another end coupled to a common electrode; and a second pixel unit, comprising:
- a fourth switch, having a control end coupled to the $(n+1)^{th}$ scanning line, a first end coupled to the $m^{th}$ data line, and a second end coupled to a second main pixel;
- a fifth switch, having a control end coupled to the $(n+1)^{th}$ scanning line, a first end coupled to the $m^{th}$ data line, and a second end coupled to a second subpixel;
- a sixth switch, having a control end coupled to the $n^{th}$ scanning line and a second end coupled to the second subpixel, wherein n and m are positive numbers; and
- a second capacitor, having one end coupled to a first end of the sixth switch and another end coupled to the common electrode, wherein the first capacitor and the second capacitor comprise a first metal layer, a dielectric layer and a second metal layer, and the dielectric layer is one of a gate insulation layer, an insulation protection layer or a passivation layer;

wherein a data scanning manner of the display panel comprises column inversion, row inversion or frame inversion.

11. The display apparatus according to claim 10, wherein in a first period of time, the $n^{th}$ scanning line is conducted, and the first switch, the second switch and the sixth switch are switched on.

12. The display apparatus according to claim 11, wherein the first switch charges the first main pixel.

13. The display apparatus according to claim 12, wherein the second switch charges the first subpixel.

14. The display apparatus according to claim 13, wherein the sixth switch discharges to the second subpixel by using the second capacitor.

15. The display apparatus according to claim 10, wherein in a second period of time, the $(n+1)^{th}$ scanning line is conducted, and the third switch, the fourth switch and the fifth switch are switched on.

16. The display apparatus according to claim 15, wherein the fourth switch charges the second main pixel.

17. The display apparatus according to claim 16, wherein the fifth switch charges the second subpixel.

18. The display apparatus according to claim 17, wherein the third switch discharges to the first subpixel by using the first capacitor.

* * * * *